(12) United States Patent
Wishnick

(10) Patent No.: US 9,350,312 B1
(45) Date of Patent: May 24, 2016

(54) AUDIO DYNAMIC RANGE ADJUSTMENT SYSTEM AND METHOD

(71) Applicant: iZotope, Inc., Cambridge, MA (US)

(72) Inventor: Aaron Wishnick, Somerville, MA (US)

(73) Assignee: iZotope, Inc., Cambridge, MA (US)

( * ) Notice: Subject to any disclaimer, the term of this patent is extended or adjusted under 35 U.S.C. 154(b) by 1 day.

(21) Appl. No.: 14/491,608

(22) Filed: Sep. 19, 2014

Related U.S. Application Data

(60) Provisional application No. 61/879,860, filed on Sep. 19, 2013.

(51) Int. Cl.
*H03G 3/00* (2006.01)
*H03G 3/20* (2006.01)

(52) U.S. Cl.
CPC ...................... *H03G 3/20* (2013.01)

(58) Field of Classification Search
CPC ....................................................... H03G 3/20
USPC .......................................................... 381/307
See application file for complete search history.

(56) References Cited

U.S. PATENT DOCUMENTS

| | | | | |
|---|---|---|---|---|
| 2003/0086341 A1* | 5/2003 | Wells | ................ | G06F 17/30017 369/13.56 |
| 2003/0223593 A1* | 12/2003 | Lopez-Estrada | .... | G10L 21/0364 381/94.2 |
| 2015/0154977 A1* | 6/2015 | Ekman | .................. | H04M 9/082 381/66 |

* cited by examiner

*Primary Examiner* — Paul S Kim
*Assistant Examiner* — Katherine Faley
(74) *Attorney, Agent, or Firm* — David Lowry

(57) ABSTRACT

A novel system and method for adjusting the dynamic range of an audio recording or signal, which does not require user manipulation of threshold and ratio (and other parameters). Unlike prior audio compressors or limiters, the present invention provides for the ability to set the dynamic range without complicated user settings and knowledge. The process can be done automatically by a computer or processor.

8 Claims, 3 Drawing Sheets

AUDIO DYNAMIC RANGE ADJUSTMENT SYSTEM AND METHOD

This application claims priority to provisional U.S. Application Ser. No. 61/879,860 filed on Sep. 19, 2013, which is fully incorporated herein by reference.

FIELD OF THE INVENTION

The invention relates generally to audio processing. More specifically, the invention is directed towards a system and method for automatically adjusting the dynamic range of audio.

BACKGROUND OF THE INVENTION

In the fields of audio and music, it is fairly common to apply some type of dynamics processing to audio. Dynamic processing generally focuses on the volume of audio, but not necessarily in a linear fashion. In general, a dynamics processor takes an input audio recording or signal, and produces an output audio recording or signal with the amplitude (volume) adjusted, typically with some time-varying gain.

A common type of dynamics processing is known as compression, wherein the higher the input signal level, the higher the attenuation. Many compressors work using a threshold, in that when the input signal increases in magnitude and crosses the threshold, the attenuation increases by some ratio. Typically, compressors measure signal magnitude by RMS to get an average of the signal energy, although other magnitude measurements, such as peak value, can also be used.

In audio, the term "dynamic range" refers to the range between how loud and how quiet the signal gets. In music, for example, it is common to use dynamics processors to compress the dynamic range to allow for an overall louder signal. Mastering limiters are a special kind of dynamic processor to bring up the overall loudness while preventing clipping. Dynamics processors are also used in other places, for example, to process voice in post-production for broadcast and film.

The most commonly used tool for adjusting the dynamic range of audio is a dynamics processor. They all work roughly the same: there is a level detector, a threshold and ratio that specify how to convert from detected level to target gain, and ballistics for smoothing out the target gain into a smooth gain envelope. For a compressor as already mentioned for example, below the threshold, the target gain is 0 dB (corresponding to no change), and above the threshold, the target gain is reduced by more and more as the threshold is exceeded: i.e. for a ratio of 2:1, for each 1 dB above the threshold that the signal reaches, the target gain will be reduced by 2 dB. Both of these parameters must be tuned depending on the signal. For example, a quieter signal may require a lower threshold. A signal with more dynamic range may require a higher ratio. Different signals may require different types of dynamics processing in combination, i.e. a gate in addition to a compressor. In other words, to achieve the same desired dynamic range, different signals require significantly different types of processing, which must be adjusted by a skilled engineer.

For the smoothing ballistics, an attack time is used when going over the threshold, and a release time is used when going back below it. The attack and release are generally set to allow fast enough response to transients without pumping, while still providing sufficient control over dynamics. If the attack and release times are too long, this may cause pumping, where loudness drops noticeable around a transient. Furthermore, slow ballistics also reduce the effect of the dynamics processing. On the other hand, if they are too short, the gain envelope may vary too quickly, causing noticeable nonlinear distortion.

A disadvantage of typical "threshold and ratio" dynamic processors is that they require a skilled operator to adjust the multiple parameters to obtain high quality results. This often requires trained listening skills as well as exceptional knowledge of the particular dynamic processor. It is difficult for casual users and amateurs to obtain good results with such tools.

BRIEF SUMMARY OF THE INVENTION

The following presents a simplified summary of the invention in order to provide a basic understanding of some aspects of the invention. This summary is not an extensive overview of the invention. It is not intended to identify key or critical elements of the invention or to delineate the scope of the invention. The following summary merely presents some concepts of the invention in a simplified form as a prelude to the more detailed description provided below.

The present invention includes a novel system and method for adjusting the dynamic range of an audio recording or signal, which does not require user manipulations of threshold and ratio (and other parameters). Embodiments of the present invention provide the ability to set the dynamic range without complicated user settings and knowledge. The process can be done automatically by a computer or processor.

Embodiments of the present invention include a method for modifying the dynamic range of an audio recording, including receiving an audio recording; creating a source histogram of audio level measurements of the audio recording for a plurality of time points; and obtaining a target histogram of audio level measurements. The embodiments further include calculating a histogram equalization mapping from the source histogram to the target histogram; creating a gain envelope for the audio recording based on the histogram equalization mapping; and modifying a gain of the audio recording by applying the gain envelope to the audio recording. Such embodiments may be implemented in software on a general or special purpose computer processor, or may be implemented in hardware or firmware. Audio recordings may be analog or digital audio signals or stored files or media.

Other embodiments include obtaining a target histogram of audio level measurements BY creating the target histogram from a selected second audio recording. They may also include a step of determining a smoothing of the gain envelope. An example of a step for determining a smoothing of a gain envelope include for a block or section of the audio recording, creating a plurality of different smoothing envelopes for that block; then for each of the created smoothing envelopes, determining a level of distortion resulting from applying the smoothing envelope to the block of the audio recording; and then selecting one of the smoothing envelopes that minimizes audible distortion for that block of audio recording.

Still other embodiments include before creating a source histogram of audio level measurements, dividing the audio recording into plurality of frequency bands; and after modifying a gain of at least one frequency band of the audio recording, combining the plurality of frequency bands back together.

Other embodiments of the present invention include a non-transitory computer-readable storage medium having instructions, that when executed by a processor, cause the processor to perform a method including receiving an audio recording;

creating a source histogram of audio level measurements of the audio recording for a plurality of time points; obtaining a target histogram of audio level measurements; calculating a histogram equalization mapping from the source histogram to the target histogram; creating a gain envelope for the audio recording based on the histogram equalization mapping; and modifying a gain of the audio recording by applying the gain envelope to the audio recording.

Still other embodiments include an audio dynamic range adjustment system, which may include an audio level measurement component, configured to receive an audio recording, and to create a source histogram of audio level measurements of the audio recording for a plurality of time points; a histogram equalization mapping component, configured to receive the source histogram and a target histogram, and to calculate a histogram equalization mapping from the source histogram to the target histogram; a gain envelope creating component, configured receive the histogram equalization mapping, and to create a gain envelope for the audio recording; and a gain component, configured to modify a gain of the audio recording based on the gain envelope.

An advantage of one more embodiments is that a user does not have to specify such parameters as threshold or ratio.

Embodiments of the present invention may be used for applications including:
  Processing a fully mixed music recording to match its dynamic range to either a "target" recording that is known to sound good, or a desired dynamic range.
  Specifying the dynamic range for music using learned dynamic ranges for a variety of genres, instruments, etc.
  Intelligently mixing different instruments in a multitrack recording by specifying a desired dynamic range per-instrument.
  Processing voice for broadcast, including matching loudness of recordings of the same voice in different environments, to make them sound more similar.
  Automatic compliance with loudness standards such as BS.1770.

BRIEF DESCRIPTION OF THE DRAWINGS

A more complete understanding of the present invention and the advantages thereof may be acquired by referring to the following description in consideration of the accompanying drawings, in which like reference numbers indicate like features, and wherein.

DETAILED DESCRIPTION OF THE INVENTION

In the following description of the various embodiments, reference is made to the accompanying drawings, which form a part hereof, and in which is shown by way of illustration various embodiments in which the invention may be practiced. It is to be understood that other embodiments may be utilized and structural and functional modifications may be made without departing from the scope of the present invention.

The present invention provides a new technique for adjusting a dynamic range of an audio recording of signal. One or more embodiments allow specifying a dynamic range directly, without requiring as much manual adjustment that depends on the source material. The target gain may be computed automatically, without needing to set a threshold or ratio, and ballistics are adaptively varied, depending on the properties of the audio, taking into account the audibility of the signal distortion.

One or more embodiments work in two phases. A first step is to compute the target gain to be applied to the audio for each point in time. However, if this gain were applied directly, there would be noticeable distortion. Therefore a second step is to compute a smoothed gain envelope that trades off intelligently between applying the target gain envelope as aggressively as possible, and avoiding noticeable distortion.

Figure 1:
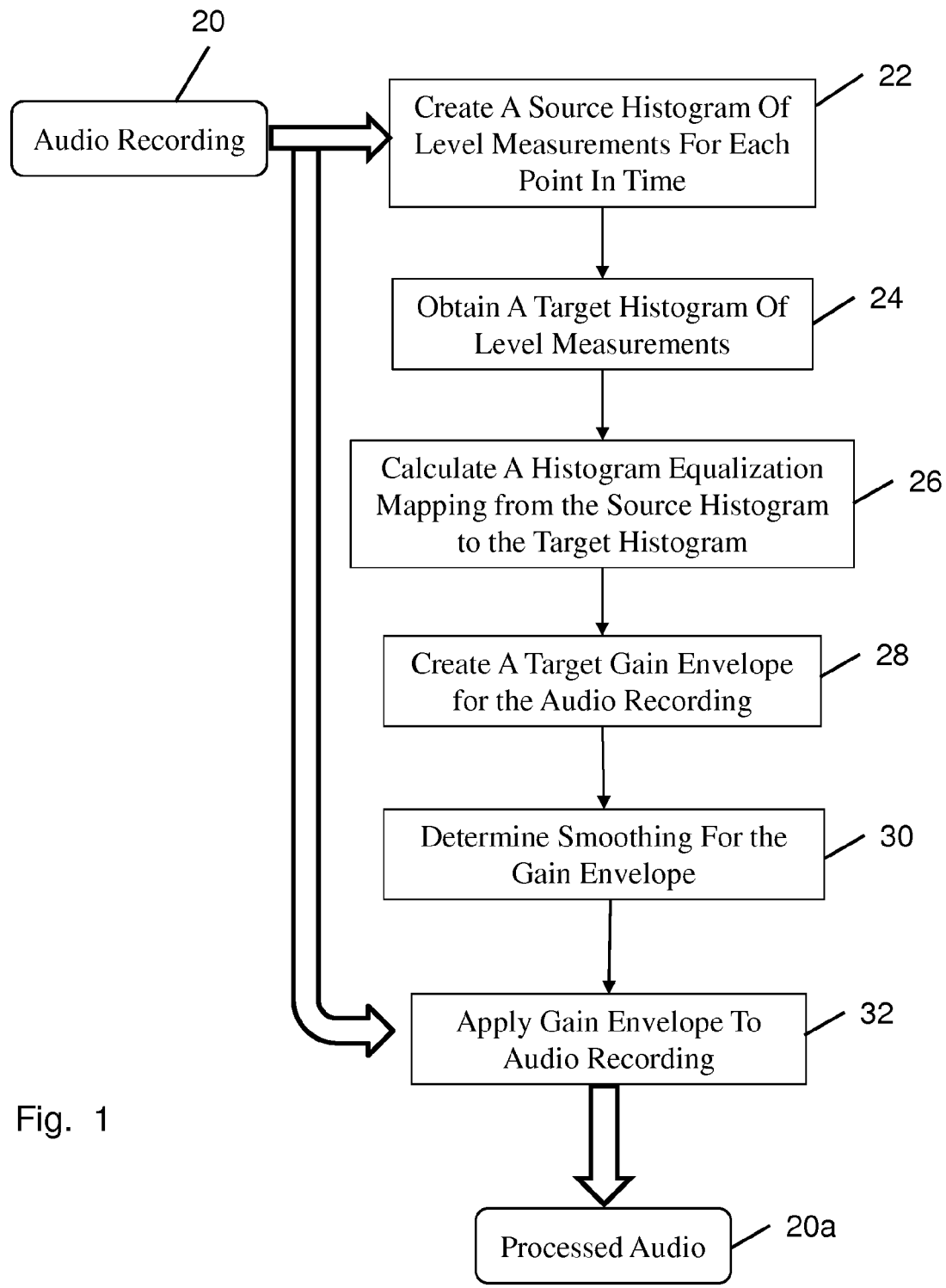
FIG. 1 illustrates a method according to one more embodiments of the present invention.

FIG. 1 illustrates an embodiment that works by specifying a dynamic range directly, without the user having to specify such parameters as threshold or ratio. The embodiment represents dynamic range by a histogram of signal level. The source level histogram is computed by computing a level measurement of the audio signal 20 at each point in time, and assigning each value to histogram bins, step 22. For example, a level histogram might consider amplitudes from −60 dB to 20 dB, over a range of 4096 bins. For each detected level, the level is converted to bins by the formula:

(num_bins−1)*(amp−min_amp)/(max_amp−min_amp)

and the value for that bin is incremented by 1.

The levels measurement 22 could be done in a variety of ways including peak, RMS, using the Hilbert transform to compute a "true" signal envelope, or even a more perceptual loudness measurement such as BS.1770 loudness standard. For one or more embodiments an approximation to the Hilbert transform is used.

In addition to computing a level histogram of the "source" audio signal to be transformed, an embodiment uses a "target" level histogram, step 24. The target histogram can be chosen in a number of ways. It can be measured from a "known good" signal specified by the user, i.e. a well-mastered audio track. In this way, the dynamics of one piece of audio can be made to be similar to another. Alternatively, it can be controlled parametrically, for example, it could be a Normal distribution whose mean and variance are supplied by the user. Further, it may be selected from a list of several options that are supplied to the user, i.e. to meet different loudness standards, or to choose dynamic ranges common for different genres of music.

Once the source and target level histograms are obtained, an equalization mapping of the source histogram to the target histogram is calculated, step 26. From this, a target gain envelope is constructed that, when applied to the source signal, would result in a level histogram similar to the target, step 28. There exist techniques in the domain of image processing for doing this; it is known as "histogram specification." One simple method is given at http://fourier.eng.hmc.edu/e161/lectures/contrast_transform/node3.html, though more precise methods do exist. Here are the steps to this simple histogram equalization algorithm, for source histogram s(i) and target histogram t(i):

1. Compute cumulative sums of each histogram, $$S(i) = \sum_{j=0}^{i} s(j) \text{ and } T(i) = \sum_{j=0}^{i} t(j)$$

2. Compute a mapping function for each bin i, which returns the bin number j for the element T(j) that is closest to S(i):

$M(i) = \text{argmin}_j |T(j) - S(i)|$

3. The histogram specification mapping M(i) can then be used to compute a target gain envelope, step 28.

Note that other more precise methods for histogram specification exist, and could be used advantageously for this process. One such algorithm is described in Bevilacqua, A. and Azzari, P. "A High Performance Exact Histogram Specification Algorithm", 2007.

Figure 3:
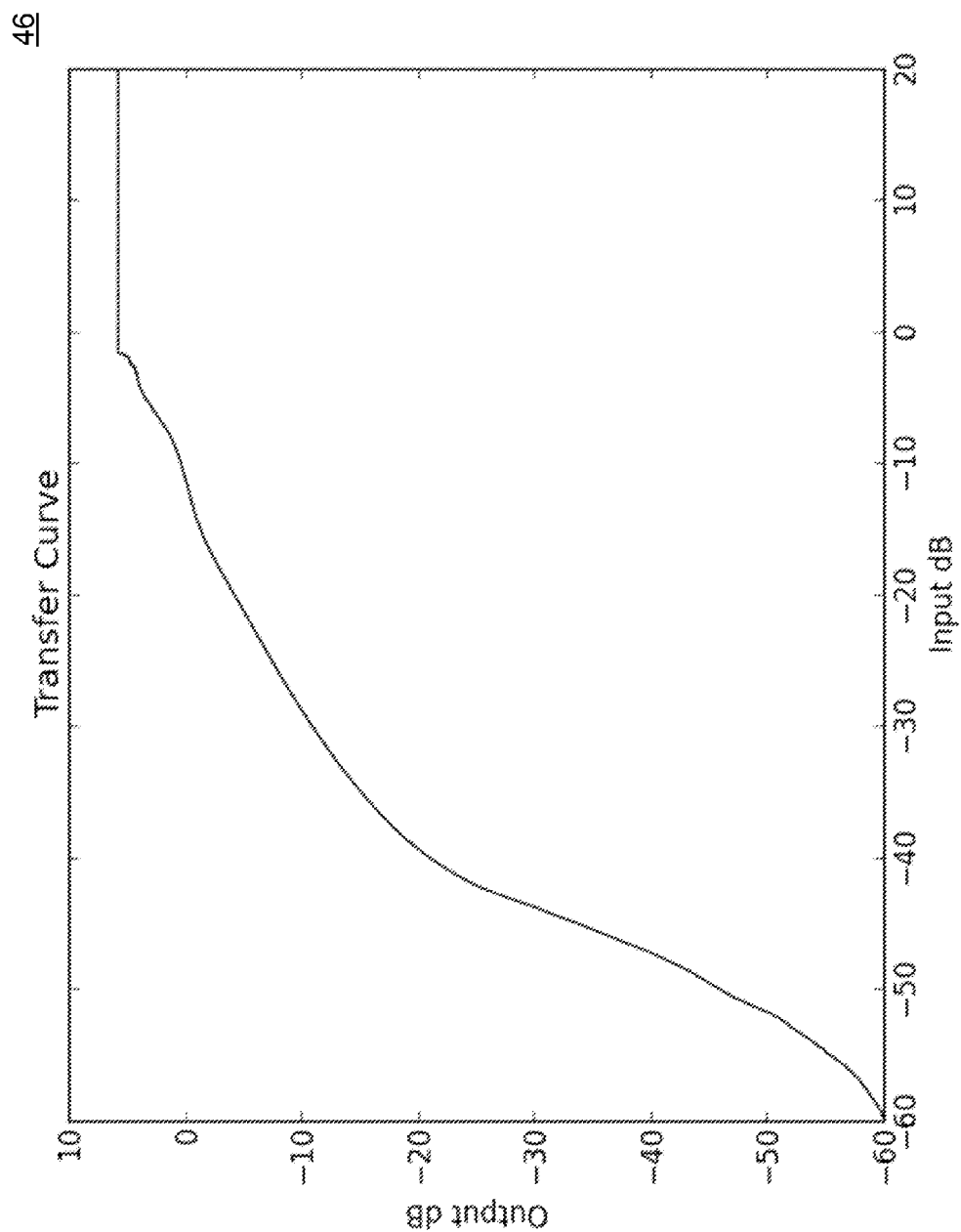
FIG. 3 illustrates a sample transfer curve according to one or more embodiments.

An example transfer curve 46 is shown in FIG. 3. This illustrates graphically what a histogram equalization mapping according to one or more embodiments would do. Each input level measurement from the audio signal (shown on the X axis) would be mapped to a new output level (on the Y axis). In this example curve, the output gain is capped as shown by the transfer curve becoming flat at around 0 dB, so this indicates the output signal would be limited to not exceed 0 dB.

Given the histogram equalization mapping calculated at step 26, the target gain envelope is computed for each sample of the source signal, step 28. This may be done by recalling the detected levels for the source audio signal, determining which bin of the histogram that level is assigned to, applying the mapping function to that bin index, and then converting back from bin index to signal level. The difference between the resulting signal level and the source signal level is the target gain, in dB. Below, let l(n) be the detected level, in dB, at the nth sample of the source signal, and M(i) be the histogram specification mapping computed above.

$$\text{amp\_to\_bin}(x) = (\text{num\_bins}-1)(x-\text{min\_amp})/(\text{max\_amp}-\text{min\_amp})$$

$$\text{bin\_to\_amp}(i) = \text{min\_amp}+(i(\text{max\_amp}-\text{min\_amp}))/(\text{num\_bins}-1)$$

$$\text{tgt\_amp}(n) = \text{bin\_to\_amp}(M(\text{round}(\text{amp\_to\_bin}(l(n)))))$$

$$\text{tgt\_gain}_{db}(n) = \text{tgt\_amp}(n) - l(n)$$

$$\text{tgt\_gain}(n) = \text{pow}(10, \text{tgt\_gain}_{db}(n)/20)$$

Figure 2:
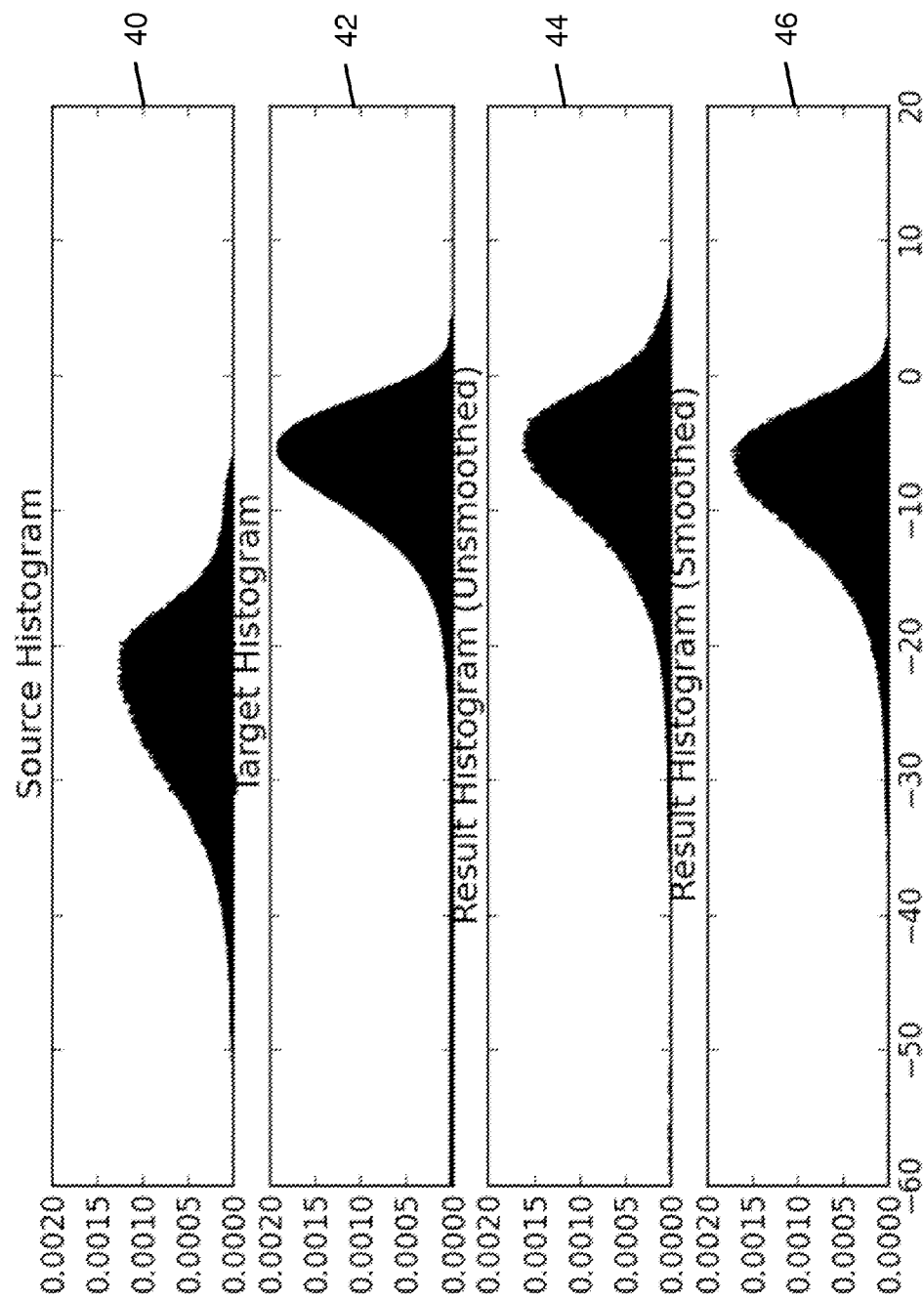
FIG. 2 illustrates sample histograms calculated according to one or more embodiments of the present invention.

FIG. 2 illustrates some example histograms according to one or more embodiments of the present invention. A source histogram 40 was created by analyzing an audio recording as described. The audio recording may be any type of recording, including analog or digital recording, stored or streamed from any type of storage media. FIG. 2 also illustrates a target histogram 42. As previously described, there are multiple techniques for creating or calculating the target histogram. The histogram equalization mapping as previously described, is illustrated as a result histogram 44, although according to one or more embodiments, a result histogram is not created, but instead the histogram equalization mapping is created. Similarly, a result histogram with smoothing 46 is shown for illustration purposes. The smoothing will be described below.

At this point, there is a target gain envelope that, if applied directly, would have the desired effect on dynamic range, but with possible nonlinear distortion. In one or more embodiments, it is helpful to smooth the gain envelope, FIG. 1 step 30, just enough to make this nonlinear distortion inaudible enough, while keeping it as close as possible to the target gain envelope, so that the dynamic range will be changed in the desired way.

The attack- and release-based ballistics commonly used for dynamics processors are not suitable here. First, "attack" and "release" only make sense when there is a threshold to go over. If the histogram mapping M(i) is viewed as a transfer curve, it tends to have a shape much different from the piecewise-linear shape of a threshold and ratio-based transfer curve. Trying to use attack and release would result in an erratic sounding gain envelope that would not achieve the desired effect. Second, attack and release need to be chosen depending on the source audio signal, and it is a goal of one or more embodiments to have the same settings work for different source audio material.

For this goal, a variety of differently smoothed envelopes are considered for each block of the audio signal. In order to effectively choose the suitable envelope for each section of the audio data, in one or more embodiments a psychoacoustic model is employed. For these embodiments, a main goal is to provide as aggressive dynamic range control as possible, but without causing noticeable distortion. The goal of the psychoacoustic model is to evaluate the audibility of distortion produced by each of those envelopes. A full description of a psychoacoustic model is provided in co-owned U.S. patent application Ser. No. 14/075,759 entitled "Audio Limiter System and Method, filed on Nov. 8, 2013, which is fully incorporated herein by reference.

For these embodiments, a variety of smoothed gain envelopes are computed. In one embodiment, a Hann filter is used: the target gain envelope is convolved with a filter kernel defined by the relation $$w(n) = 0.5(1 - \cos((2\pi n)/(N-1)))$$

A variety of filter lengths N are used. One embodiment uses 12 different filter lengths, distributed exponentially from 0 ms to 100 ms, so that more shorter smoothing times exist. Increasing the number of filter lengths would give the psychoacoustic algorithm a greater variety of envelopes to choose from, potentially increasing quality.

Each smoothed gain envelope can optionally be modified by applying peak limiting. This was found to be necessary because if peaks are not limited, the overall dynamic range will have to be shifted down significantly to be quieter, to avoid clipping. Without peak limiting, a target dynamic range that is aggressively loud is difficult to achieve, because the smoothed gain envelopes have not been constructed to prevent clipping.

The peak limiting phase can be achieved by using any transparent limiting algorithm. In one or more embodiments, the IRC II algorithm, commercially available in Ozone 5 from iZotope, Inc. but any peak limiting algorithm may be used. For this step, an embodiment has a target peak level that is desired to limit the signal to. One option is that the target peak level could be 0 dB, just to prevent clipping. When this algorithm is being used to match one signal to the dynamic range of another, the target signal's peak level can be used. Note that unlike the earlier level detection for the level histogram, peak level detection (unsmoothed absolute value of the source signal) should be used for this step, since we are trying to limit peak signal levels.

Each smoothed gain envelope is applied to the source signal. Then, the resulting signal is processed through the peak limiter, using the target peak level that was determined. The peak limiter returns a new gain envelope, that reduces the gain in areas where it is necessary to avoid clipping, and does not alter the gain otherwise. This gain envelope (in sample-amplitude) is multiplied with the smoothed gain envelope, resulting in a new smoothed gain envelope that also prevents clipping.

At this point, an embodiment may have a variety of smoothed gain envelopes, which may or may not have been modified to limit peak signal levels. In this step, they are combined to form a single smoothed gain envelope that is as aggressive as possible, without causing noticeable distortion. The flowchart of the algorithm is as follows, for each time frame:

Each smoothed gain envelope is applied to the signal.
A psychoacoustic model is used to evaluate masking thresholds induced by the original signal in each critical band of human hearing.

The energies of each of the processed signals from step 1 are normalized to match the energy of the original signal. Then the signals are subtracted from the original signal in order to form the difference (distortion) signals. The power of each distortion signal is distributed into critical bands of human hearing and compared with the masking thresholds produced by the psychoacoustic model in step 2.

Using the computed power of the distortion signal, a score is computed, that penalizes higher amounts of distortion, while promoting envelopes with lower smoothing times.

The gain envelope with the shortest smoothing time whose distortion score is still below a user-specified audibility threshold is chosen as the "best" gain envelope for this time frame.

Finally, once the best gain envelope is computed at each time frame, they are combined to get the best gain envelope for the entire signal.

Once the best gain envelope is computed for the entire signal, FIG. 1 step 30, it is applied by multiplying the original signal by the combined gain envelope, step 32.

As mentioned, the present invention does not involve such conventional dynamics processor controls as threshold, ratio, attack, or release. However there are multiple new controls that may be used by one or more embodiments of the present invention. A first control is the target level histogram. As mentioned, this could include loading and analyzing another audio signal, parametrically specifying a dynamic range (i.e. by setting the mean and variance of a Normal distribution, or any other parameterization), or loading a pre-specified histogram that could be supplied with the algorithm, or be distributed otherwise.

Another control is for distortion threshold. This parameter controls the tradeoff between faithfully matching the desired dynamic range, and minimizing distortion.

Another control is for peak limiting margin. This is the level to which the signal is limited in the peak limiting step. If the target histogram comes from analysis of another audio signal, this peak limiting parameter could be chosen automatically by finding the highest peak level in that target audio signal. The user could optionally adjust the margin further.

Embodiments of the present invention may be implemented in a variety of ways. An embodiment may be implemented in software for a general purpose computer processor, wherein a digital audio recording or signal is provided. The audio may be from a stored audio file, or a live stream in real-time. Analog signals may also be processed, with level measurements being done against an analog signal, and then gain curves used to adjust the analog signal. An embodiment may also be implemented in hardware, either analog or digital, with either analog or digital audio signals. Hardware may include digital signal processor (DSP) technology, or general purpose processors.

Other embodiments of the present invention may be utilized in the form of multiband processing. As previously described, one or more embodiments operate on a full bandwidth audio signal. However, it can be advantageous to divide an audio recording or signal up into a variety of frequency bands (usually 2-4) using a crossover filter, process them in accordance with an embodiment, and then combine them. A variety of multiband dynamics processors exist, such as the one in iZotope Ozone 5.

In this case, there is not just one target level histogram, but one target level histogram per crossover band. The rest of the process is the same, but just operating on each of these filtered signals separately. After recombining the dynamics-processed crossover bands, a separate peak limiting phase at the end may be desirable, since peak limiting separate signals, and summing them together does not guarantee that the summed signal is also peak limited.

Another embodiment may be for realtime use. As described, an embodiment requires analysis to compute the histogram mapping function M(i), step 26 FIG. 1. One or more embodiments can also be used for realtime processing of an audio signal. This requires analysis of some segment of the audio signal to be processed, or a similar signal. The analysis would proceed as described above, up until the point where the histogram mapping function is computed. At this point, all the rest of the processing can operate in realtime. For example, the user could analyze just a verse and chorus of a recorded song, or a voice actor could speak a little into the microphone setup they will be using. Then, for realtime processing, the resulting histogram mapping function can be used to compute target gains given the current audio to process, and the gains can be smoothed, combined, and applied, as described.

One or more aspects of the invention may be embodied in computer-usable data and computer-executable instructions, such as in one or more program modules, executed by one or more computers, processors, or other devices. Generally, program modules include routines, programs, objects, components, data structures, etc. that perform particular tasks or implement particular abstract data types when executed by a processor in a computer or other device. The computer executable instructions may be stored on a computer readable medium such as a hard disk, optical disk, removable storage media, solid state memory, RAM, flash drive, etc. As will be appreciated by one of skill in the art, the functionality of the program modules may be combined or distributed as desired in various embodiments. In addition, the functionality may be embodied in whole or in part in firmware or hardware equivalents such as integrated circuits, field programmable gate arrays (FPGA), and the like. Further, embodiments may be embedded in the hardware or firmware of new equipment.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

I claim:

1. A method performed by a processor for modifying the dynamic range of an audio recording, the method comprising:
   receiving an audio recording;
   creating a source histogram of audio level measurements of the audio recording for a plurality of time points;
   obtaining a target histogram of audio level measurements;
   calculating a histogram equalization mapping from the source histogram to the target histogram;
   creating a gain envelope for the audio recording based on the histogram equalization mapping; and
   modifying a gain of the audio recording by applying the gain envelope to the audio recording.

2. The method of claim 1 wherein the step of obtaining a target histogram of audio level measurements includes creating the target histogram from a selected second audio recording.

3. The method of claim 1 further including:
   after the step of creating a gain envelope, determining a smoothing of the gain envelope.

4. The method of claim 3 wherein the step of determining a smoothing of the gain envelope includes further including:

for a block of the audio recording, creating a plurality of different smoothing envelopes for that block;

for each of the created smoothing envelopes, determining a level of distortion resulting from applying the smoothing envelope to the block of the audio recording; and selecting one of the smoothing envelopes that minimizes audible distortion for that block of audio recording.

5. The method of claim 1 further including:

before creating a source histogram of audio level measurements, dividing the audio recording into plurality of frequency bands.

6. The method of claim 5 further including:

after modifying a gain of at least one frequency band of the audio recording, combining the plurality of frequency bands back together.

7. A non-transitory computer-readable storage medium having instructions, that when executed by a processor, cause the processor to perform a method comprising:

receiving an audio recording;

creating a source histogram of audio level measurements of the audio recording for a plurality of time points;

obtaining a target histogram of audio level measurements;

calculating a histogram equalization mapping from the source histogram to the target histogram;

creating a gain envelope for the audio recording based on the histogram equalization mapping; and modifying a gain of the audio recording by applying the gain envelope to the audio recording.

8. An audio dynamic range adjustment system, comprising:

an audio level measurement component, configured to receive an audio recording, and to create a source histogram of audio level measurements of the audio recording for a plurality of time points;

a histogram equalization mapping component, configured to receive the source histogram and a target histogram, and to calculate a histogram equalization mapping from the source histogram to the target histogram;

a gain envelope creating component, configured receive the histogram equalization mapping, and to create a gain envelope for the audio recording; and a gain component, configured to modify a gain of the audio recording based on the gain envelope.

* * * * *